United States Patent
Yu

(10) Patent No.: US 6,475,707 B2
(45) Date of Patent: Nov. 5, 2002

(54) METHOD OF REWORKING PHOTORESIST LAYER

(75) Inventor: Chia-Chieh Yu, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 21 days.

(21) Appl. No.: 09/746,516

(22) Filed: Dec. 22, 2000

(65) Prior Publication Data

US 2002/0081534 A1 Jun. 27, 2002

(51) Int. Cl.[7] .............................. G03F 7/38; G03F 7/42
(52) U.S. Cl. ....................... 430/325; 430/296; 430/327; 430/329
(58) Field of Search ................................ 430/327, 329, 430/325, 296

(56) References Cited

U.S. PATENT DOCUMENTS 5,811,358 A * 9/1998 Tseng et al. ................. 430/329
6,218,085 B1 * 4/2001 Molloy et al. ............... 430/329
6,235,453 B1 * 5/2001 You et al. .................... 430/329

* cited by examiner

Primary Examiner—Richard L. Schilling
(74) Attorney, Agent, or Firm—Charles C. H. Wu; Wu & Cheung, LLP

(57) ABSTRACT

A method of reworking a photoresist layer. A silicon chip having an insulation layer, a bottom anti-reflection coating and a photoresist layer thereon is provided. The photoresist layer has already been light-exposed and developed. A wet etching operation is carried out to remove a large portion of the photoresist layer. A low-temperature plasma treatment incapable of transforming the anti-reflection coating structure is conducted to remove the hardened residual photoresist material. A new photoresist layer is formed over the bottom anti-reflection coating.

6 Claims, 1 Drawing Sheet

METHOD OF REWORKING PHOTORESIST LAYER

BACKGROUND OF THE INVENTION

1. Field of Invention

The present invention relates to a method of reworking a semiconductor device. More particularly, the present invention relates to a method of using a low-temperature plasma treatment to remove a photoresist layer.

2. Description of Related Art

Photolithography is often regarded a critical step in the fabrication of semiconductor devices. In the fabrication of MOS device structures, anything from the patterning of thin films to dopants implants involves photolithographic processes. Following the rapid increase in the level of integration for integrated circuits, dimensions of each semiconductor device are reduced. With a corresponding reduction in line width, photolithographic process has become complicated and difficult. To increase production yield, a bottom anti-reflection coating is formed over a substrate before deposition photoresist material on top. Such an arrangement can reduce standing wave and halftone during exposure so that more accurate pattern is transferred.

After photoresist development, quality of the photoresist layer is usually inspected, the so-called after development inspection (ADI) before the next photolithographic step is executed. When misalignment or other types of errors is found in the photoresist pattern, the photoresist layer must be reworked to prevent permanent damage to the entire batch of chips in subsequent processes.

Conventional method of reworking the photoresist layer includes removing the incorrectly developed photoresist layer from the silicon chip by wet etching. Since the photoresist layer has already been cured and bombarded by electron beam, wet etching can hardly remove every bit of the photoresist layer. Consequently, oxygen plasma is often employed to remove the hardened photoresist layer. Thereafter, a new photoresist layer is formed over the silicon chip followed by subsequent exposure and resist development.

However, most bottom anti-reflection coating contains silicon oxynitride (SiON) aside from organic material. Since silicon oxynitride has a rather unstable chemical structure, especially when heated to a temperature above 150° C., the silicon oxynitride may turn into silicon oxide.

Because conventional oxygen plasma treatment is conducted at a temperature above 200° C., the silicon oxynitride material inside the anti-reflection coating is likely to transform into silicon oxide. In general, light absorption or attenuation capacity of a silicon oxynitride layer is affected by its silicon oxide content. In other words, reflectivity of the silicon oxynitride layer will increase leading to a deterioration of anti-reflection capacity. Hence, after using a conventional oxygen plasma treatment to remove photoresist layer, the newly formed photoresist layer on the reworked surface will have a lower capacity to reproduce critical dimensions due to an increase in reflectivity for the anti-reflection coating. In other words, quality of the reworked photoresist pattern is likely to drop.

SUMMARY OF THE INVENTION

Accordingly, one object of the present invention is to provide a method of reworking a photoresist layer capable of preventing a drop in anti-reflection capacity of a silicon oxynitride layer.

A second object of the invention is to provide a method of reworking a photoresist layer capable of preventing a reduction in the critical dimensions of a subsequently formed photoresist layer.

To achieve these and other advantages and in accordance with the purpose of the invention, as embodied and broadly described herein, the invention provides a method of reworking a photoresist layer. A silicon chip having an insulation layer, a bottom anti-reflection coating and a photoresist layer thereon is provided. The photoresist layer has already been light-exposed and developed. A wet etching operation is carried out to remove a large portion of the photoresist layer. A low-temperature plasma treatment incapable of transforming the anti-reflection coating structure is conducted to remove the hardened residual photoresist material. Finally, a new photoresist layer is formed over the bottom anti-reflection coating.

One major aspect of this invention is the use of a low-temperature plasma treatment to remove residual photoresist material after wet etching so that the bottom anti-reflection coating can maintain its anti-reflection capacity. Since the silicon oxynitride material within the anti-reflection layer is heated to a relatively low temperature in the plasma treatment, the rate of transformation of silicon oxynitride into silicon oxide is low. Hence, anti-reflection capacity of the bottom anti-reflection coating is retained after reworking.

In addition, the maintenance of anti-reflection capacity after plasma treatment helps to preserve the critical dimensions of the newly deposited photoresist layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
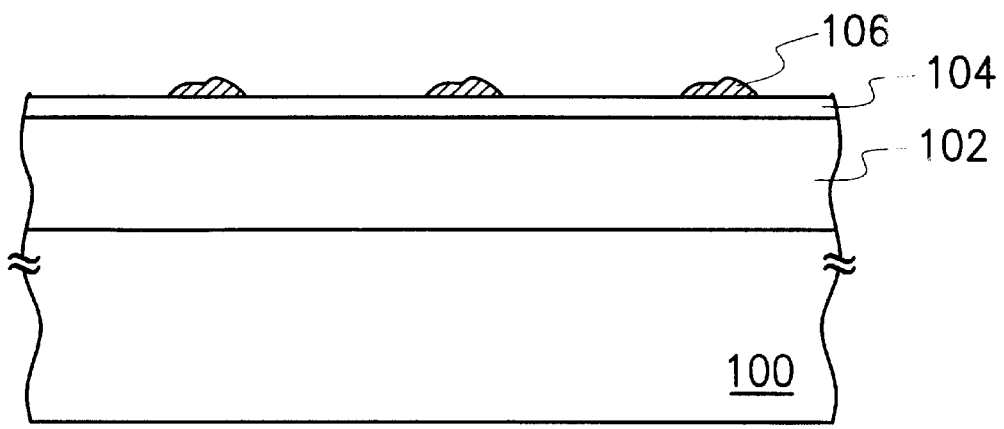
FIGS. 1A through 1C are schematic cross-sectional views showing the progression of steps for reworking a photoresist layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
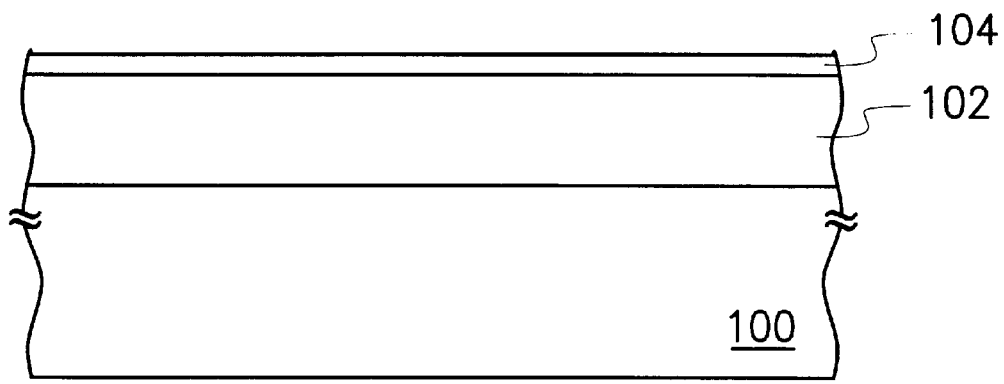
Figure 1C:
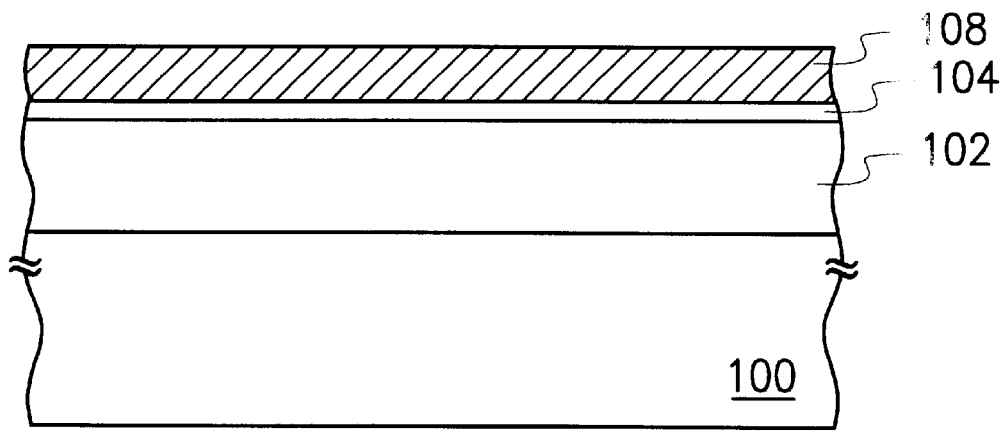

FIGS. 1A through 1C are schematic cross-sectional views showing the progression of steps for reworking a photoresist layer according to one preferred embodiment of this invention. As shown in FIG. 1A, a silicon chip 100 having an insulation layer 102, a bottom anti-reflection coating 104 and a photoresist layer (not shown) thereon is provided. The insulation layer 102 can be a silicon oxide layer and the bottom anti-reflection coating 104 can be a silicon oxynitride layer, for example. The photoresist layer has already been exposed and chemically developed. Moreover, the photoresist layer has found to contain defects in an after development inspection so that the photoresist layer needs to be reworked. A wet etching operation is conducted to remove the photoresist layer. Since the photoresist layer has already been cured and shone on by an electron beam, some residual photoresist material will remain after the wet etching step. Hence, bits of residual photoresist material 106 will remain on the bottom anti-reflection coating 104.

As shown in FIG. 1B, a low-temperature plasma treatment incapable of damaging the bottom anti-reflection coating is conducted to remove the hardened residual photoresist material 106. The low-temperature plasma treatment is carried out, for example, using oxygen, nitrogen or a mixture of nitrogen/hydrogen at a temperature around 150° C. Because the photoresist material 106 is removed at a relatively low temperature, the amount of structural transformation from silicon oxynitride to silicon oxide in the bottom anti-reflection coating 104 is at a minimum. Consequently, there is very little increase in the reflectivity of the anti-reflection coating 104.

As shown in FIG. 1C, a new photoresist layer 108 is formed over the bottom anti-reflection layer 104. The photoresist layer 108 is formed, for example, by spin coating. Since the anti-reflection coating has not transformed into a high reflectivity silicon oxide layer during plasma treatment, standing wave or halftone of light will not occur when patterning the newly deposited photoresist layer 108. Ultimately, critical dimensions of pattern on the photoresist layer 108 can be maintained.

In summary, a low-temperature plasma treatment is used to remove residual photoresist material after wet etching so that the bottom anti-reflection coating can maintain its anti-reflection capacity. Since the silicon oxynitride material within the anti-reflection layer is heated to a relatively low temperature in the plasma treatment, the rate of transformation of silicon oxynitride into silicon oxide is low. Hence, anti-reflection capacity of the bottom anti-reflection coating is retained. The maintenance of anti-reflection capacity after plasma treatment helps to preserve the critical dimensions of the newly deposited photoresist layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reworking a photoresist layer, comprising the steps of:

providing a silicon chip having an insulation layer, a bottom anti-reflection coating and a first photoresist layer thereon;

removing a portion of the first photoresist layer;

performing a low-temperature plasma treatment to remove the remaining first photoresist material from the bottom anti-reflection coating, wherein the low-temperature plasma treatment is conducted at a temperature around 150° C. or less and is incapable of transforming the anti-reflection coating; and forming a second photoresist layer over the bottom anti-reflection coating.

2. The method of claim 1, wherein step of removing a portion of the first photoresist layer includes wet etching.

3. The method of claim 1, wherein the step of performing the low-temperature plasma treatment includes using oxygen.

4. The method of claim 1, wherein the step of performing the low-temperature plasma treatment includes using nitrogen.

5. The method of claim 1, wherein the step of performing the low-temperature plasma treatment includes using a mixture of nitrogen and hydrogen.

6. The method of claim 1, wherein material constituting the bottom anti-reflection coating includes silicon oxynitride.

\* \* \* \* \*